US005499754A

United States Patent [19]
Bobbio et al.

[11] Patent Number: 5,499,754
[45] Date of Patent: Mar. 19, 1996

[54] FLUXLESS SOLDERING SAMPLE PRETREATING SYSTEM

[75] Inventors: Stephen M. Bobbio, Wake Forest; Nicholas G. Koopman; Sundeep Nangalia, both of Raleigh, all of N.C.

[73] Assignee: MCNC, Research Triangle Park, N.C.

[21] Appl. No.: 339,770

[22] Filed: Nov. 15, 1994

Related U.S. Application Data

[62] Division of Ser. No. 155,020, Nov. 19, 1993, Pat. No. 5,407,121.

[51] Int. Cl.$^6$ .................... C23F 1/02; B23K 3/08
[52] U.S. Cl. .............. 228/42; 228/33; 204/298.38; 156/345; 118/723 ME
[58] Field of Search .................. 228/33, 42, 205, 228/219, 223; 118/723 MW, 723 ME; 204/298.38; 156/643.1, 345, 646.1; 216/69; 427/575

[56] References Cited

U.S. PATENT DOCUMENTS 4,012,307  3/1977  Phillips .................. 204/192 E (List continued on next page.)

FOREIGN PATENT DOCUMENTS

| 003660 | 2/1978 | European Pat. Off. . |
| 034041 | 8/1981 | European Pat. Off. . |
| 0427020A2 | 10/1990 | European Pat. Off. . |
| 3206809A1 | 2/1983 | Germany . |
| 3442538A | 7/1985 | Germany . |
| 2152246 | 6/1990 | Japan . |

OTHER PUBLICATIONS

H. Manko, *Solders and Soldering*, McGraw Hill, New York, 1992, pp. 157–158, 160–161, 373–375, 380–381.
C. Mackay, *Flux Reactions and Solderability in Solder Joint Reliability*, Van Nostrand Reinhold, NY, 1991, pp. 2, 73–80.
J. Licari et al., *Hybrid Microcircuit Technology Handbook*, Noyes Publications, NJ, 1988, p. 235.

Ken'ichi Mizuishi, et al., *Fluxless and Virtually Voidless Soldering for Semiconductor Chips*, IEEE Transactions on Components, Hybrids, and Manufacturing Technology, vol. 11, No. 4, Dec. 1988, pp. 447–451.
P. A. Moskowitz, et al. *Thermal Dry Process Soldering*, J. Vac. Scie. Technol. A, vol. 4, No. 3, May, Jun. 1986.
P. A. Moskowitz, et al., *Summary Abstract: Laser–Assisted Dry Process Soldering*, J. Vac. Sci. Technol. A., vol. 3, No. 3, May/Jun. 1985.
*Dry Soldering Process Using Halogenated Gas*, IBM Technical Disclosure, vol. 27, No. 11, Apr. 1985, p. 6513.
E. Genieys, *Brazing in Reducing Fluoride–Containing Atmospheres*, The British Association for Brazing and Soldering, First International Brazing and Soldering Conference, London, 27–29, Nov. 1972.
Ammann et al., *Fluxless Condensation Soldering*, Industrial and Scientific Conference Management, Inc.
Liedke, *Wellenlöten ohne Flussmittel*, F&M Feinwerktechnik & Messtechnik, vol. 101, No. 7/8, Aug. 1993, pp. 308–312, XP000387212.

*Primary Examiner*—Samuel M. Heinrich
*Attorney, Agent, or Firm*—Bell, Seltzer, Park & Gibson

[57] ABSTRACT

A fluxless soldering sample pretreating system includes a sample chamber having an opening therein and a sample holder. A sample chamber extension extends outwardly from the opening to define a passageway from the sample chamber extension, through the opening, and into the sample chamber. A fluorine-containing gas is supplied into the sample chamber extension. Am energy source such as a microwave oven surrounds the sample chamber extension. The microwave oven produces microwave energy in the sample chamber extension to form a plasma therein and dissociate the fluorine-containing gas into atomic fluorine. A perforated aluminum plate extends transversely across the passageway and blocks the plasma from traversing the passageway from the sample chamber extension into the sample chamber, while allowing the atomic fluorine to traverse the passageway from the sample chamber extension into the sample holder. A second chamber extension, gas supply and microwave oven may be added to improve uniformity for large samples.

22 Claims, 3 Drawing Sheets

U.S. PATENT DOCUMENTS

| | | | |
|---|---|---|---|
| 4,081,121 | 3/1978 | Picard | 228/181 |
| 4,328,044 | 5/1982 | Chasteen | 134/2 |
| 4,405,379 | 9/1983 | Chasteen | 134/2 |
| 4,498,046 | 2/1985 | Faris et al. | 324/158 F |
| 4,504,007 | 3/1985 | Anderson, Jr. et al. | 228/123 |
| 4,577,398 | 3/1986 | Sliwa et al. | 29/590 |
| 4,646,958 | 3/1987 | Howard, Jr. | 228/123 |
| 4,821,947 | 4/1989 | Nowotarski | 228/219 |
| 4,921,157 | 5/1990 | Dishon et al. | 228/124 |
| 4,979,664 | 12/1990 | Lyons et al. | 228/180.2 |
| 5,000,819 | 3/1991 | Pedder et al. | 156/643 |
| 5,048,746 | 9/1991 | Elliott et al. | 228/180.1 |
| 5,071,058 | 12/1991 | Nowotarski | 228/219 |
| 5,090,651 | 2/1992 | Mittag | 228/219 |
| 5,121,874 | 6/1992 | Deambrosio et al. | 228/219 |
| 5,139,193 | 8/1992 | Todd | 228/180.2 |
| 5,145,104 | 9/1992 | Apap et al. | 228/179 |
| 5,158,224 | 10/1992 | Baker et al. | 228/37 |
| 5,164,566 | 11/1992 | Spletter et al. | 219/121.63 |
| 5,192,582 | 3/1993 | Liedke et al. | 228/206 |
| 5,193,739 | 3/1993 | Liedke et al. | 228/205 |
| 5,413,673 | 5/1995 | Fujimoto | 156/345 |

FLUXLESS SOLDERING SAMPLE PRETREATING SYSTEM

CROSS REFERENCE TO RELATED APPLICATION

This application is a divisional of application Ser. No. 08/155,020, filed Nov. 19, 1993, now U.S. Pat. No. 5,407,121, the disclosure of which is hereby incorporated herein by reference.

FIELD OF THE INVENTION

This invention relates to soldering systems and more particularly to fluxless soldering systems.

BACKGROUND OF THE INVENTION

In fabricating electronic systems, integrated circuits ("chips") or other electrical devices are mounted on printed wiring boards, or other substrates. The contact between the chip and substrate must have physical, chemical and electrical integrity and stability. Copper is particularly useful as a layer in microelectronic devices, because of its good conductivity properties.

In one technique for physically and electrically connecting microelectronic devices, metal pads are fabricated on an exposed surface of a substrate. These metal pads are often formed with a top layer of solder, i.e., a low melting point alloy, usually of the lead-tin type, used for joining metals at temperatures about 230° C. The solder pads are brought into contact with a metal structural element that will be wet with liquid solder when heat is applied to join the solder and the metal pad and thereby form the electrical connection. Other techniques use a solder preform which is placed between the substrate and device. Yet other techniques use solder bumps which are applied to the device or to the substrate.

Typically, soldering processes include three basic steps: (1) pre-cleaning and deoxidation of surface oxides; (2) solder reflow and/or reflow joining; and (3) post-soldering cleaning. Different flux materials are used in the pre-cleaning step to prepare the surfaces for the soldering step by removal of contaminants and metal oxides from the solder surface. For example, activated fluxes, such as zinc, ammonium chloride, mineral acid-containing materials, and the like, are typically used in "coarse" soldering applications, i.e., repairing coarse wiring in motors or houses. The solder joining step can occur only after the oxide coating is removed because the high melting point oxides will prevent wetting of the two surfaces to be joined by reflow of solder. The third step, post-soldering cleaning, removes flux residue remaining after the reflow.

Highly acidic fluxes are used for the soldering of aluminum layers. Aluminum has a tenacious oxide layer which is chemically very inert and difficult to remove. Thus, mild rosin fluxes are ineffective with aluminum, and special fluxes containing acid compounds which are highly corrosive, such as inorganic acids in a cadmium fluoroborate vehicle, must be used. Fluxes used with aluminum can also contain metal chlorides, fluorides, and ammonium compounds.

Because of the gross corrosive nature of these fluxes, and the high attack rates on metals in microelectronic assemblies, such fluxes cannot be used in microelectronics. For microelectronic devices, the standard practice is to reduce the acid activity of the flux to a mildly activated or non-activated grade in an attempt to minimize the adverse effects of the flux on the components. Typical soldering processes for copper layers in microelectronic applications use rosins which form a very mild organic acid when melted at the soldering temperature but which are relatively inert at room temperature.

Although corrosion and other risks can be minimized in copper soldering applications using mild flux agents, flux is necessary to keep the solder from oxidizing, allow it to flow and wet the parts being soldered. In addition, with the shrinking size of all electronic components and bonding pads, the rapidly growing use of surface mount technology, and the increasing demand for flip-chip device bonding, the post reflow cleaning of flux residues is becoming increasingly difficult. The small gaps between assembled parts, and solidification cavities in mixed soldered joints are very resistant to penetration by cleaning liquids. Inefficient post-soldering cleaning can reduce the long term reliability of the whole assembly. Further, there can be other problems associated with non-activated or mildly activated flux processes, such as higher defect levels and high rework costs. Opto-electronic devices are also very sensitive to flux residues due to absorption and bending of the optical signals.

A fluxless soldering process, particularly for soldering microelectronic devices including a copper layer, therefore can have several advantages. A dry or fluxless soldering process can replace the pre-cleaning step and totally eliminate the post-soldering cleaning step. Fluxless soldering has also gained increasing importance in recent years due to concerns for the environmental effect of common cleaning agents, such as chlorofluorocarbons.

Various attempts at fluxless soldering have been made but with limited success. Some fluxless processes have used halogenated gases. For example, P. Moskowitz et al., J.Vac.Sci.Tech. 4, (May/June 1986) describe a dry soldering process for solder reflow and bonding of lead/tin solder. The process uses halogen-containing gases to reduce the surface oxide to enable solder reflow at temperatures above the solder-melting point. The activation energy needed for the oxide reduction by these gases is lowered by use of a catalyst, platinum mesh, in a vacuum chamber. Yet the temperature needed for successful reflow bonding is 300° C., well above typical soldering temperatures for most electronic applications of about 220° C. Thus, this process can damage the components, the substrate, and generate defects due to thermal mismatch between different materials.

IBM Technical Disclosure Bulletin 27 (April 1985) describes the use of halogenated gases in an inert carrier gas at elevated temperatures to produce a reduction of solder oxide by the reactive gas and to allow solder reflow. Again, for the more common low temperature applications, thermal damage may result.

P. Moskowitz et al., J.Vac.Sci.Tech. 3 (May/June 1985) describe a laser-assisted fluxless soldering technique for solder reflow. This technique uses laser radiation to excite an otherwise nonreactive gas in the presence of preheated solder surface. This technique requires direct access of the laser beam to the solder surface, thus limiting the applications as well as resulting in a low throughput process.

German Patent No. 3,442,538 discloses a method of soldering semiconductor elements wherein a semiconductor element having an aluminum layer is subjected to a fluorine-containing plasma. The treated aluminum surface is then contacted with a soft solder. Process conditions include treating the aluminum layer with a fluorine-containing plasma for at least 1 hour in a vacuum at a temperature of about 147° C. to 397° C. Alternative process conditions use a standard soldering iron, presumably in the presence of flux, to remove oxides. Further, as with several of the processes described above, the temperatures used are well above typical soldering temperatures for most electronic applications, and can result in damage to the components.

A major advance in fluxless soldering is described in U.S. Pat. No. 4,921,157 to Dishon and coinventor Bobbio entitled "Fluxless Soldering Process" and assigned to the assignee of the present invention. The Dishon et al. patent discloses the use of fluorine-containing plasma excitation on solder to eliminate or reduce the need for fluxing agents. Parent application Ser. No. 08/155,020 discloses the use of a fluorine-containing plasma on a copper surface of a copper layer to allow soldering without the need for fluxing agents. However, in order to obtain full advantage of these fluxless soldering processes which use fluorine-containing plasma on a sample, there is a need for an efficient fluxless soldering sample pretreating system which can efficiently apply a fluorine-containing plasma to a sample.

SUMMARY OF THE INVENTION

It is therefore an object of the present invention to provide an improved fluxless soldering sample pretreating system.

It is another object of the invention to provide an improved sample pretreating system for pretreating a sample with fluorine-containing plasma.

These and other objects are provided according to the present invention by a fluxless soldering sample pretreating system which includes a sample chamber having an opening therein and also having a sample holder in the sample chamber for holding the sample. A sample chamber extension extends outwardly from the opening in the sample chamber to define a passageway from the sample chamber extension, through the opening, and into the sample chamber. A fluorine-containing gas is supplied into the sample chamber extension.

The pretreating system also includes an energy source, preferably a microwave energy source, for supplying energy to the sample chamber extension. The microwave energy source may be a microwave oven having a microwave oven cavity which surrounds the sample chamber extension. The microwave oven produces microwave energy in the sample chamber extension to form a plasma therein and dissociate the fluorine-containing gas into atomic fluorine. Gas permeable plasma containing means is included in the passageway to block the plasma from traversing the passageway from the sample chamber extension into the sample chamber, while allowing the atomic fluorine to traverse the passageway from the sample chamber extension into the sample chamber.

Preferably, the gas permeable plasma containing means is a perforated aluminum plate which extends transversely across the passageway. Also, in order to improve the uniformity of the exposure of the sample to fluorine-containing plasma, the plasma chamber preferably includes a second microwave oven, the cavity of which surrounds a second sample chamber extension, a second fluorine-containing gas supply into the second sample chamber extension, and second gas permeable plasma containing means in the second passageway. Efficient pretreatment of fluxless soldering samples is provided thereby.

DESCRIPTION OF THE DRAWINGS

Other objects and advantages of the invention and the manner in which the same are accomplished will be more completely understood with reference to the detailed description and to the drawings in which.

DETAILED DESCRIPTION OF THE INVENTION

The present invention will be now described more fully hereinafter with reference to the accompanying drawings, in which a preferred embodiment of the invention is shown. This invention can, however, be embodied in many different forms and should not be construed as limited to the embodiment set forth herein; rather, applicants provide this embodiment so that this disclosure will be thorough and complete, and will fully convey the scope of the invention to those skilled in the art. Like characters refer to like elements throughout.

Figure 1:
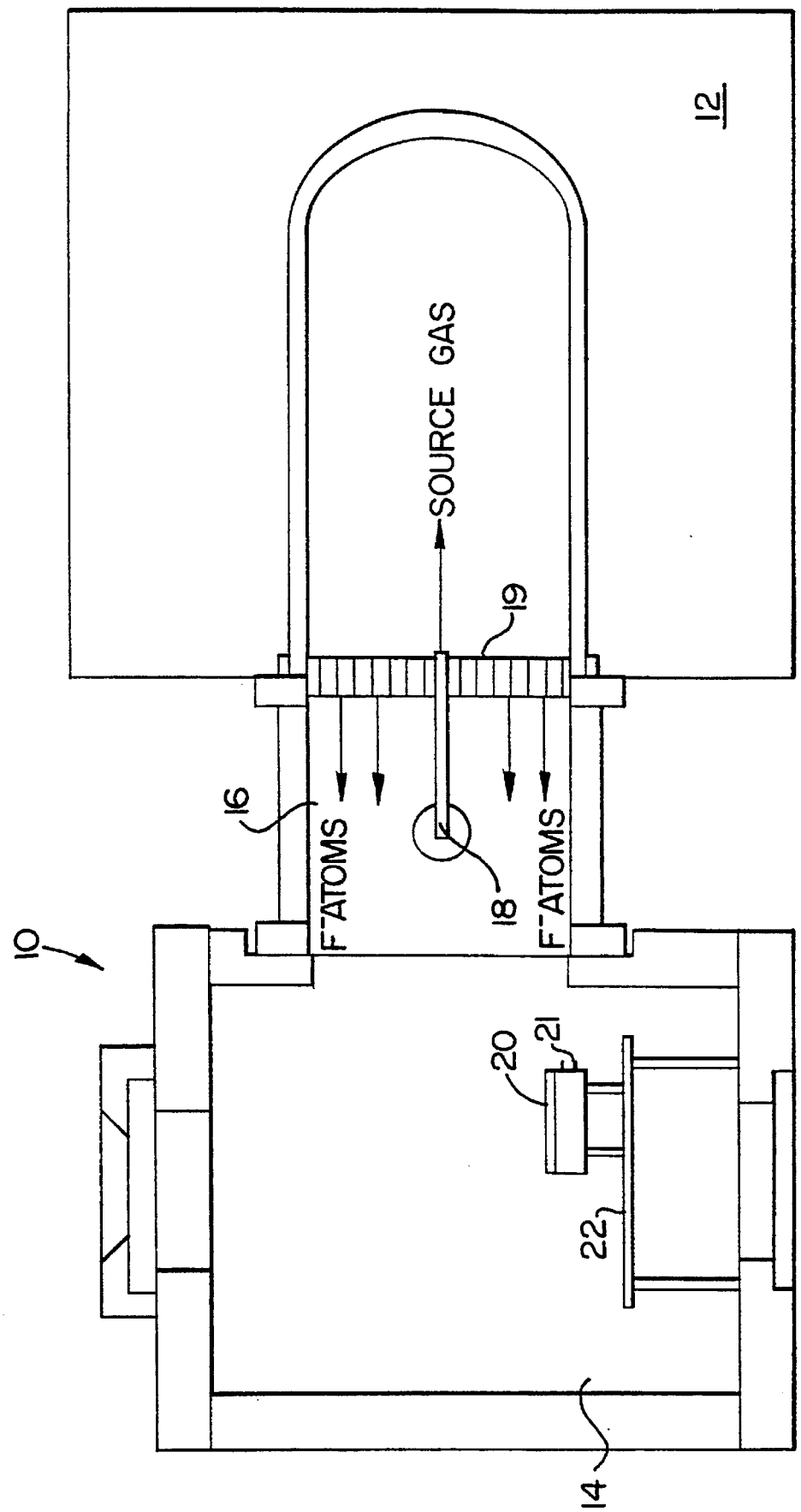
FIG. 1 schematically illustrates a side view of an apparatus for pretreating a sample in a fluorine-containing plasma in accordance with the present invention.

FIG. 1 schematically illustrates a side view of a preferred copper layer pretreatment apparatus 10 according to the present invention. As illustrated, pretreatment apparatus 10 includes a plasma energy generating chamber 12, a sample treatment chamber 14, and a passageway 16 connecting chambers 12 and 14.

A fluorine-containing gas, such as $SF_6$, $CF_4$ and the like, is provided from gas supply line 18 into the plasma energy generating chamber 12. Here, energy is generated sufficient to disassociate the fluorine-containing gas to form atomic fluorine. The plasma energy may be generated using any of the techniques known in the art for creating a fluorine-containing plasma. In one advantageous embodiment of the invention, the plasma generating energy is provided from a microwave source, such as a microwave oven.

The disassociated fluorine atoms diffuse from the plasma energy generating chamber 12 through passageway 16 and into the sample reaction chamber 14. Preferably, a perforated aluminum plate 19 is provided between plasma energy generating chamber 12 and passageway 16. The aluminum plate contains the active plasma generation to within chamber 12 so the samples are not exposed to the plasma generating energies or temperatures. This also allows free flow of gases, so fluorine atoms can enter the sample chamber and react with the surface oxides on the sample. In addition, aluminum reacts very slowly with fluorine and passivates so fluorine atom concentration in the sample chamber 14 is maximized and very little fluorine is absorbed by the aluminum.

A sample which is to be exposed to the fluorine-containing gases is provided within sample chamber 14. As illustrated, the sample can be, for example, a copper layer 20 provided on a substrate 21 and having an exposed copper surface. Typically, the copper will be a microelectronic substrate, integrated circuit, or other such device, having solderable pads with an outer copper surface. As will be appreciated by the skilled artisan, the exposed copper surface includes copper oxide compounds. Advantageously, the copper sample is placed on a sample stage 22, which can be thermally coupled to a heating means (not shown) for selectively adjusting the temperature of the stage, and thus the copper sample, prior to and during the pretreatment step.

The surface of the copper layer 20 is pretreated by exposing the copper surface to the gases from the fluorine-containing plasma. The plasma pretreating process conditions are selected to provide the desired degree of exposure of the copper surface to fluorine atoms. Advantageously, conditions are selected so that the copper surface is exposed to fluorine atoms for a time sufficient so as to convert at least some of the copper oxide compounds present on the surface thereof to fluorine-containing compounds, i.e., copper oxyfluoride compounds, as explained in more detail below. Stated differently, the copper surface is exposed to the fluorine-containing plasma gases until sufficient fluorine-containing compounds form on the copper surface to permit subsequent wetting of solder to occur.

Preferably, the pretreating exposing step is conducted to provide a fluorine/oxygen ratio on the copper surface of about 2/1 to about 8/1. Although the exact mechanism of the fluorine/oxygen interaction is not understood, tests have demonstrated that the pretreatment of the copper layer in accordance with the invention is especially effective when the fluorine/oxygen ratio on the surface of the copper layer falls within this range. The exact ratio will vary according to the amount of copper surface oxides present prior to pretreatment, the time of pretreatment, the distance of the sample from the fluorine atom source, and the like.

The temperature of the copper layer can be varied during exposure to the fluorine atoms. For example, the pretreatment of the copper layer can take place at room temperature (about 20° to 24° C.). Alternatively, pretreatment may occur at elevated temperatures, i.e., the copper layer can be heated to a temperature up to about 120° C. or higher. Preferably, the plasma process is short in duration, i.e., about 2 to 30 minutes, and plasma pressures are from about 400 to 800 mTorr. Power level, gas flow, gas mixture and other typical plasma process conditions can vary according to the reactor configuration and the nature of the assembly to be treated.

Figure 3:
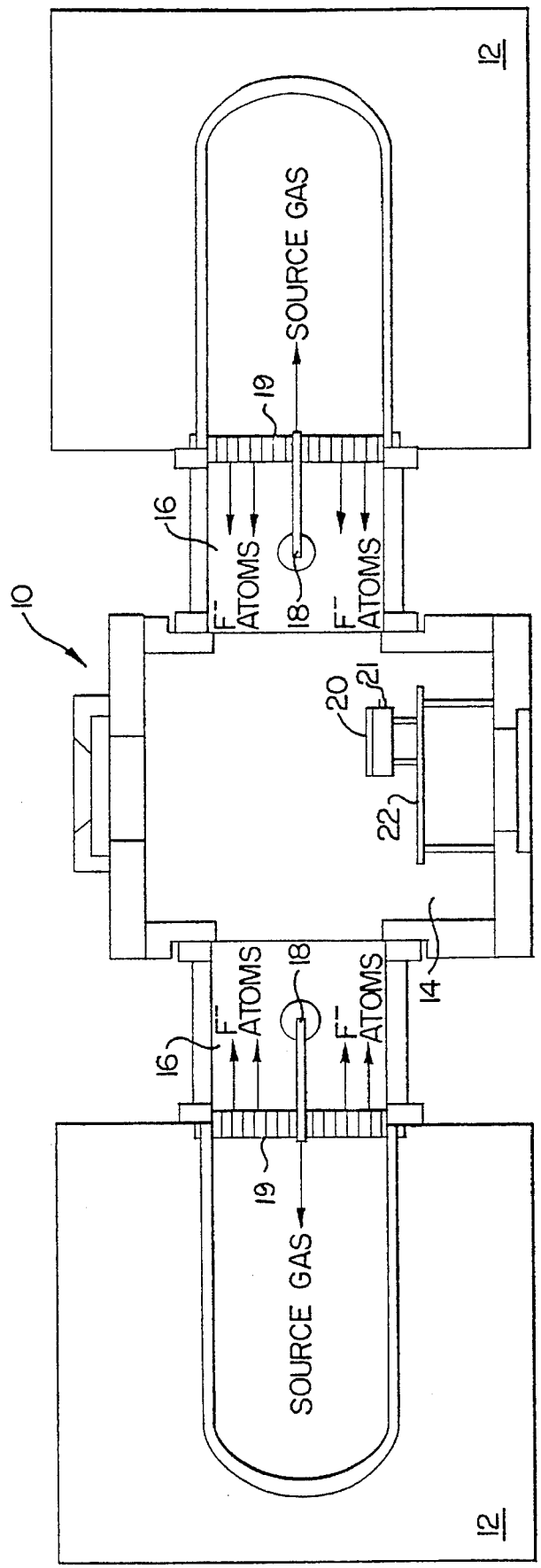
FIG. 3 schematically illustrates a side view of a second apparatus for pretreating a sample in a fluorine-containing plasma in accordance with the present invention.

Advantageously, a second plasma energy generating chamber (illustrated in FIG. 3) is coupled to the sample chamber 14 opposite plasma energy chamber 12, to provide a more thorough and equal distribution of the fluorine atoms onto the copper surface.

Although applicants do not wish to be bound by any theory, it is believed that exposing the copper layer, particularly copper oxide compounds on the surface of the copper layer, to fluorine atoms results in a reaction wherein copper oxyfluorides are formed on the surface of the copper layer. This effectively transforms surface oxides which prevent solder reflow or wetting of surfaces to be solder joined, and thus allows for effective soldering to take place without the need for fluxing agents, high temperatures, and the like. It is further believed that the activation energy needed for converting the oxides is supplied by excited fluorine radicals in the plasma which diffuse and hit the surface oxide, resulting in the formation of the fluoride compounds on the copper layer surface.

Following exposure of the copper layer 20 to the fluorine-containing plasma, the substrate 21 containing the copper layer is removed from the treatment chamber 14. Solder is then placed on the copper surface. The solder can be of any appropriate soldering material, such as tin, lead-tin, and lead-tin based alloys. Advantageously, the solder is an eutectic 63% tin, 37% lead material having a melting point of 183° C.

The solder is reflowed to form either a solder bump or to reflow and join a second surface. The second surface may be a component or another solder bump. Alternatively the copper surface can be dipped in a molten solder bath or wave and the copper surface "tinned" with the appropriate solder alloy. As noted with regard to plasma forming and exposing conditions above, the process conditions for reflow can be selected to optimize reflow. Thus reflow can be performed in an oxidizing atmosphere, i.e., air, or alternatively under an inert atmosphere, such as nitrogen. Similarly, reflow can take place under atmospheric pressure or under vacuum pressure conditions, although the latter is not necessary.

In addition, reflow can take place at temperatures just above the melting point of the solder. For example, using a 63/37 weight percent tin/lead material, reflow takes place just above the melting point of the solder of 183° C. at a temperature of about 200° C. to 220° C.

The fluorine-containing plasma pretreatment process is subject to numerous variations. For example, the plasma pretreatment step and the reflow process may occur simultaneously and/or the second surface may be brought in contact with the solder during reflow. In addition, copper samples can be pretreated in the sample pretreatment chamber, removed and stored for up to one week under an oxidizing ambient, i.e., air, and then transported for successful joining in a different facility. Alternatively, pretreated copper samples can be stored for up two weeks in an inert ambient, i.e., nitrogen, and then subjected to reflow conditions.

Figure 2:
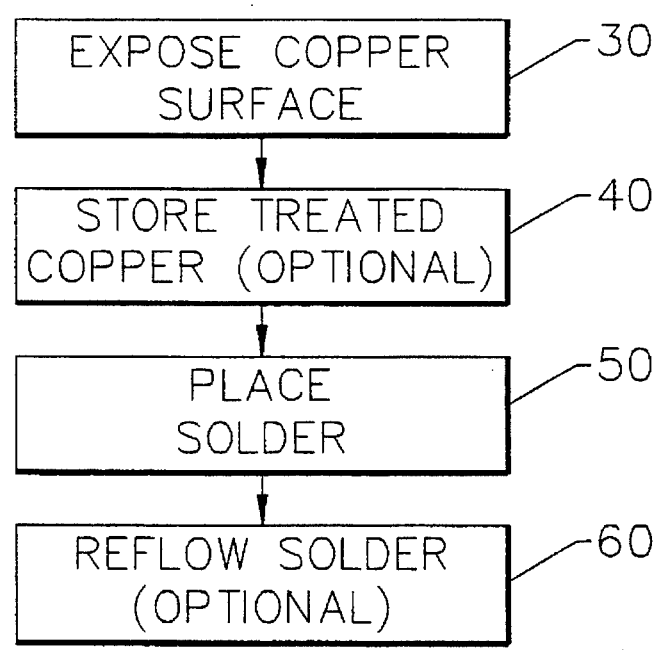
FIG. 2 is a flowchart illustrating operation of a process of pretreating a copper layer and fluxless soldering thereof according to parent application Ser. No. 08/155,020.

Referring now to FIG. 2, a preferred process for pretreating and fluxless soldering of a copper layer in accordance with the invention of application Ser. No. 08/155,020 is illustrated. A substrate which includes a copper layer having an exposed copper surface is provided. As illustrated in Block 30 of FIG. 2, the copper surface thereof is exposed to a fluorine-containing gas in a downstream microwave plasma. The plasma pretreating process conditions of Block 30 are selected to provide the desired degree of exposure of the copper surface to fluorine atoms. As noted above, advantageously, conditions are selected so that the copper surface is exposed to fluorine atoms for a time sufficient so as to convert at least some of the copper oxide compounds present on the surface thereof to fluorine-containing compounds, i.e., copper oxyfluoride compounds. Preferably, the pretreating exposing step is conducted to provide a fluorine/oxygen ratio on the copper surface of about 2/1 to about 8/1.

The exposure of the copper layer can take place at room temperature (about 20° to 24° C.). Alternatively, elevated temperatures can be used, i.e., the copper layer can be heated to a temperature up to about 120° C. or higher. Preferably, the plasma process is short in duration, i.e., about 15 to 30 minutes, and plasma pressures are from about 400 to 800 mTorr.

As indicated in Block 40, following exposure of the copper surface to a fluorine-containing plasma, the copper sample can optionally stored for up to one week under an oxidizing ambient, i.e., air. Alternatively, pretreated copper samples can be stored for up two weeks in an inert ambient, i.e., nitrogen.

Solder is then placed on the copper surface as indicated in Block 50. In Block 60, following solder placement the solder is reflowed. Reflow can be performed in an oxidizing atmosphere, i.e., air, or alternatively under an inert atmosphere, such as nitrogen. Similarly, reflow can take place under atmospheric pressure or under vacuum pressure conditions, although the latter is not necessary. In addition, reflow can take place at temperatures just above the melting point of the solder. For example, using a 63/37 weight percent tin/lead material, reflow takes place just above the melting point of the solder of 183° C. at a temperature of about 200° C. to 220° C. As also described above, the reflow step can occur as part of a joining step.

In the drawings and specification, there have been disclosed typical preferred embodiments of the invention, and although specific terms are used, they are used in a generic and descriptive sense only and not for purpose of limitation, the scope of the invention being set forth in the following claims.

That which is claimed is:

1. A fluxless soldering sample pretreating system, comprising:

a sample chamber having an opening therein;

sample holding means in said sample chamber for holding a sample;

a sample chamber extension, extending outwardly from said opening in said sample chamber, to define a passageway from said sample chamber extension through said opening and into said sample chamber;

fluorine-containing gas supplying means, for supplying fluorine-containing gas into said sample chamber extension;

a microwave oven including a microwave oven cavity, said microwave oven cavity surrounding said sample chamber extension, said microwave oven producing microwave energy in said sample chamber extension to form a plasma therein and dissociate the fluorine-containing gas into atomic fluorine; and gas permeable plasma containing means in said passageway, for blocking the plasma from traversing said passageway from said sample chamber extension into said sample chamber, while allowing the atomic fluorine to traverse said passageway from said sample chamber extension into said sample chamber, to thereby perform fluorine-containing plasma excitation on said sample.

2. A pretreating system according to claim 1 wherein said sample chamber further includes a second opening therein, said pretreating system further comprising:

a second sample chamber extension, extending outwardly from said second opening in said sample chamber, to define a second passageway from said second sample chamber extension through said second opening and into said sample chamber;

a second microwave oven including a second microwave oven cavity, said second microwave oven cavity surrounding said second sample chamber extension;

said fluorine-containing gas supplying means further supplying fluorine-containing gas into said second sample chamber extension; and second gas permeable plasma containing means in said second passageway, for blocking plasma from traversing said second passageway from said second sample chamber extension to said sample chamber, while allowing fluorine radicals to traverse said second passageway from said second sample chamber extension to said sample chamber.

3. A pretreating system according to claim 1 further comprising means for heating said sample holding means to thereby heat the sample.

4. A pretreating system according to claim 1 wherein said fluorine-containing gas supplying means is a fluorine-containing gas supply line having an outlet in said sample chamber extension.

5. A pretreating system according to claim 4 wherein said fluorine-containing gas supply line extends from said sample chamber, through said gas permeable plasma containing means, and into said sample chamber extension.

6. A fluxless soldering sample pretreating system comprising:

a sample chamber having an opening therein;

sample holding means in said sample chamber for holding a sample;

a sample chamber extension, extending outwardly from said opening in said sample chamber, to define a passageway from said sample chamber extension through said opening and into said sample chamber;

fluorine-containing gas supplying means, for supplying fluorine-containing gas into said sample chamber extension;

a microwave oven including a microwave oven cavity, said microwave oven cavity surrounding said sample chamber extension, said microwave oven producing microwave energy in said sample chamber extension to form a plasma therein and dissociate the fluorine-containing gas into atomic fluorine;

a perforated aluminum plate extending transversely across said passageway, for blocking the plasma from traversing said passageway from said sample chamber extension into said sample chamber, while allowing the atomic fluorine to traverse said passageway from said sample chamber extension into said sample chamber, to thereby perform fluorine-containing plasma excitation on said sample.

7. A pretreating system according to claim 6 wherein said sample chamber further includes a second opening therein, said pretreating system further comprising:

a second sample chamber extension, extending outwardly from said second opening in said sample chamber, to define a second passageway from said second sample chamber extension through said second opening and into said sample chamber;

a second microwave oven including a second microwave oven cavity, said second microwave oven cavity surrounding said second sample chamber extension;

said fluorine-containing gas supplying means further supplying fluorine-containing gas into said second sample chamber extension; and a second perforated aluminum plate extending transversely across said second passageway, for blocking plasma from traversing said second passageway from said second sample chamber extension to said sample chamber, while allowing fluorine radicals to traverse said second passageway from said second sample chamber extension to said sample chamber.

8. A system according to claim 6 further comprising means for heating said sample holding means to thereby heat the sample to be soldered.

9. A pretreating system according to claim 6 wherein said fluorine-containing gas supplying means is a fluorine-containing gas supply line having an outlet in said sample chamber extension.

10. A pretreating system according to claim 9 wherein said fluorine-containing gas supply line extends from said sample chamber, through said gas permeable plasma containing means, and into said sample chamber extension.

11. A fluxless soldering sample pretreating system, comprising:

a sample chamber having an opening therein;

sample holding means in said sample chamber for holding a sample;

a sample chamber extension, extending outwardly from said opening in said sample chamber, to define a passageway from said sample chamber extension through said opening and into said sample chamber;

fluorine-containing gas supplying means, for supplying fluorine-containing gas into said sample chamber extension;

means for producing energy in said sample chamber extension to form a plasma therein and dissociate the fluorine-containing gas into atomic fluorine; and gas permeable plasma containing means in said passageway, for blocking the plasma from traversing said passageway from said sample chamber extension into said sample chamber, while allowing the atomic fluorine to traverse said passageway from said sample chamber extension into said sample chamber, to thereby perform fluorine-containing plasma excitation on said sample.

12. A pretreating system according to claim 11 wherein said sample chamber further includes a second opening therein, said pretreating system further comprising:

a second sample chamber extension, extending outwardly from said second opening in said sample chamber, to define a second passageway from said second sample chamber extension through said second opening and into said sample chamber;

said energy producing means further producing energy in said second sample chamber extension;

said fluorine-containing gas supplying means further supplying fluorine-containing gas into said second sample chamber extension; and second gas permeable plasma containing means in said second passageway, for blocking plasma from traversing said second passageway from said second sample chamber extension to said sample chamber, while allowing fluorine radicals to traverse said second passageway from said second sample chamber extension to said sample chamber.

13. A pretreating system according to claim 11 further comprising means for heating said sample holding means to thereby heat the sample.

14. A pretreating system according to claim 11 wherein said fluorine-containing gas supplying means is a fluorine-containing gas supply line having an outlet in said sample chamber extension.

15. A pretreating system according to claim 14 wherein said fluorine-containing gas supply line extends from said sample chamber, through said gas permeable plasma containing means, and into said sample chamber extension.

16. A pretreating system according to claim 11 wherein said energy producing means comprises microwave energy producing means, for producing microwave energy in said sample chamber extension.

17. A fluxless soldering sample pretreating system comprising:

a sample chamber having an opening therein;

sample holding means in said sample chamber for holding a sample;

a sample chamber extension, extending outwardly from said opening in said sample chamber, to define a passageway from said sample chamber extension through said opening and into said sample chamber;

fluorine-containing gas supplying means, for supplying fluorine-containing gas into said sample chamber extension;

means for producing microwave energy in said sample chamber extension to form a plasma therein and dissociate the fluorine-containing gas into atomic fluorine;

a perforated aluminum plate extending transversely across said passageway, for blocking the plasma from traversing said passageway from said sample chamber extension into said sample chamber, while allowing the atomic fluorine to traverse said passageway from said sample chamber extension into said sample chamber, to thereby perform fluorine-containing plasma excitation on said sample.

18. A pretreating system according to claim 17 wherein said sample chamber further includes a second opening therein, said pretreating system further comprising:

a second sample chamber extension, extending outwardly from said second opening in said sample chamber, to define a second passageway from said second sample chamber extension through said second opening and into said sample chamber;

said energy producing means further producing energy in said second sample chamber extension;

said fluorine-containing gas supplying means further supplying fluorine-containing gas into said second sample chamber extension; and a second perforated aluminum plate extending transversely across said second passageway, for blocking plasma from traversing said second passageway from said second sample chamber extension to said sample chamber, while allowing fluorine radicals to traverse said second passageway from said second sample chamber extension to said sample chamber.

19. A system according to claim 17 further comprising means for heating said sample holding means to thereby heat the sample to be soldered.

20. A pretreating system according to claim 17 wherein said fluorine-containing gas supplying means is a fluorine-containing gas supply line having an outlet in said sample chamber extension.

21. A pretreating system according to claim 20 wherein said fluorine-containing gas supply line extends from said sample chamber, through said gas permeable plasma containing means, and into said sample chamber extension.

22. A pretreating system according to claim 17 wherein said energy producing means comprises microwave energy producing means, for producing microwave energy in said sample chamber extension.

* * * * *